(12) United States Patent
Wu et al.

(10) Patent No.: US 9,691,826 B2
(45) Date of Patent: Jun. 27, 2017

(54) PIXEL STRUCTURE AND MANUFACTURING METHOD THEREOF, LIGHT-EMITTING DEVICE, ARRAY SUBSTRATE AND DISPLAY DEVICE

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Haidong Wu, Beijing (CN); Junsheng Chen, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 50 days.

(21) Appl. No.: 14/415,830

(22) PCT Filed: Jun. 30, 2014

(86) PCT No.: PCT/CN2014/081199
§ 371 (c)(1),
(2) Date: Jan. 20, 2015

(87) PCT Pub. No.: WO2015/067059
PCT Pub. Date: May 14, 2015

(65) Prior Publication Data
US 2016/0043148 A1    Feb. 11, 2016

(30) Foreign Application Priority Data
Nov. 7, 2013   (CN) .......................... 2013 1 0549615

(51) Int. Cl.
*H01L 29/20* (2006.01)
*H01L 27/32* (2006.01)
(Continued)

(52) U.S. Cl.
CPC .......... *H01L 27/3218* (2013.01); *H01L 21/77* (2013.01); *H01L 27/3216* (2013.01); *H01L 51/001* (2013.01); *H01L 51/56* (2013.01)

(58) Field of Classification Search
CPC .. H01L 27/3216; H01L 27/3218; H01L 21/77
See application file for complete search history.

(56) References Cited

U.S. PATENT DOCUMENTS 7,333,080 B2 * 2/2008 Miller .................. G09G 3/2003
345/694
7,531,951 B2 * 5/2009 Yamanaka .......... H01L 27/3213
313/461
(Continued)

FOREIGN PATENT DOCUMENTS

| CN | 101320150 A | 12/2008 |
| CN | 102262854 A | 11/2011 |

(Continued)

OTHER PUBLICATIONS

Office Action issued in Chinese Application No. 201310549615.5 dated Feb. 10, 2015 (Feb. 10, 2015).
(Continued)

*Primary Examiner* — Jamie C Niesz
(74) *Attorney, Agent, or Firm* — Nath, Goldberg & Meyer; Joshua B. Goldberg

(57) ABSTRACT

The present invention discloses a pixel structure and a manufacturing method thereof, a light-emitting device, an array substrate and a display device. The pixel structure comprises a plurality of pixel units sequentially arranged, each pixel unit comprising a plurality of color sub-pixel units, wherein the color sub-pixel unit of a certain color to which human eyes have poor discriminating power is positioned in a central position of the pixel unit, and the color sub-pixel units of the remaining colors are positioned around the color sub-pixel unit of the certain color, and an area of (Continued)

the color sub-pixel unit of the certain color is larger than that of any one of the color sub-pixel units of the remaining colors.

16 Claims, 6 Drawing Sheets

(51) Int. Cl.
  *H01L 21/77* (2017.01)
  *H01L 51/00* (2006.01)
  *H01L 51/56* (2006.01)

(56) References Cited

U.S. PATENT DOCUMENTS

| | | | | |
|---|---|---|---|---|
| 7,646,398 B2* | 1/2010 | Brown Elliott | ...... | G09G 3/3607 |
| | | | | 313/470 |
| 8,115,216 B2* | 2/2012 | Smith | ................. | H01L 27/3216 |
| | | | | 257/88 |
| 8,330,352 B2* | 12/2012 | Sung | ................... | H01L 27/3216 |
| | | | | 313/504 |
| 9,252,193 B2* | 2/2016 | Kim | ..................... | H01L 27/3213 |
| 9,337,241 B2* | 5/2016 | Lee | ..................... | H01L 27/3218 |
| 2011/0291550 A1* | 12/2011 | Kim | ..................... | G09G 3/2003 |
| | | | | 313/504 |
| 2013/0105833 A1* | 5/2013 | Weaver | ............... | H01L 51/5203 |
| | | | | 257/89 |
| 2014/0197385 A1* | 7/2014 | Madigan | ................ | H01L 51/56 |
| | | | | 257/40 |
| 2014/0374781 A1* | 12/2014 | Yamagishi | ............ | C23C 14/042 |
| | | | | 257/89 |
| 2015/0354526 A1* | 12/2015 | Cripps | ..................... | E03F 3/00 |
| | | | | 290/43 |

FOREIGN PATENT DOCUMENTS

| | | |
|---|---|---|
| CN | 103545344 A | 1/2014 |
| JP | 2011071012 A | 4/2011 |

OTHER PUBLICATIONS

International Patent Application No. PCT/CN2014/081199, International Search Report dated Aug. 22, 2014, seventeen (17) pages.

* cited by examiner

DRAWINGS

PIXEL STRUCTURE AND MANUFACTURING METHOD THEREOF, LIGHT-EMITTING DEVICE, ARRAY SUBSTRATE AND DISPLAY DEVICE

This is a National Phase Application filed under 35 U.S.C. 371 as a national stage of PCT/CN2014/081199, filed Jun. 30, 2014, and claims priority benefit from Chinese Application No. 201310549615.5, filed Nov. 7, 2013, the content of each of which is hereby incorporated by reference in its entirety.

FIELD OF THE INVENTION

The present invention relates to the field of display technology, and particularly relates to a pixel structure and a manufacturing method thereof, a light-emitting device, an array substrate and a display device.

BACKGROUND OF THE INVENTION

Currently, pixel units of a color organic light-emitting diode (OLED) can be arranged in different manners, such as traditional RGB, New RGB, RGBW, RGB pentile or the like. Although there are various arrangements for pixel units, all of the pixel unit arrangements are for the purpose of achieving uniform color of display image, high resolution of display image and the like.

FIG. 1 is a schematic diagram of a pixel structure in the prior art, as shown in FIG. 1, the pixel structure comprises pixel units sequentially arranged, and each pixel unit comprises a red sub-pixel unit 1, a green sub-pixel unit 2 and a blue sub-pixel unit 3 which are of the same shape (all of a rectangular shape) and are sequentially arranged. Further, the red sub-pixel unit 1, the green sub-pixel unit 2 and the blue sub-pixel unit 3 have an equal area. The pixel structure shown in FIG. 1 adopts the traditional RGB arrangement.

In the prior art, human eyes have stronger discriminating power to red and green images than to a blue image, and therefore, in the pixel structure shown in FIG. 1, since the pixel units are arranged in traditional RGB manner and respective sub-pixel units have the equal area, matching effect between the color sub-pixel units and the visual effect of human eyes is relatively poor, thus resulting in relatively non-uniform chromaticity of a display image.

SUMMARY OF THE INVENTION

An object of the present invention is to provide a pixel structure and a manufacturing method thereof, a light-emitting device, an array substrate and a display device, so as to achieve better matching effect between the color sub-pixel units and the visual sense of human eyes, thus improving chromaticity uniformity of display image.

To achieve the above object, the present invention provides a pixel structure, comprising: a plurality of pixel units which are sequentially arranged, each pixel unit comprises a plurality of color sub-pixel units, wherein the color sub-pixel unit of a certain color to which human eyes have poor discriminating power is positioned in a central position of the pixel unit, and the color sub-pixel units of the remaining colors are positioned around the color sub-pixel unit of the certain color, and an area of the color sub-pixel unit of the certain color is larger than that of any one of the color sub-pixel units of the remaining colors.

Optionally, the plurality of color sub-pixel units comprise: a red sub-pixel unit, a green sub-pixel unit and a blue sub-pixel unit, the color sub-pixel unit of the certain color comprises the blue sub-pixel unit, the color sub-pixel units of the remaining colors comprise the red sub-pixel unit and the green sub-pixel unit.

Optionally, each pixel unit comprises one blue sub-pixel unit, two red sub-pixel units and two green sub-pixel units.

Optionally, the red sub-pixel units and the green sub-pixel units are alternately provided around the blue sub-pixel unit.

Optionally, the two red sub-pixel units are provided opposite each other, and the two green sub-pixel units are provided opposite each other.

Optionally, both the red sub-pixel unit and the green sub-pixel unit are of a rectangular shape, and the blue sub-pixel unit is of a square shape.

A length of each of the red sub-pixel units and the green sub-pixel units is three times as long as a width thereof, and a side length of the blue sub-pixel unit is twice the width of the red sub-pixel unit.

Optionally, each pixel unit is of a square shape.

Optionally, the red sub-pixel unit and the green sub-pixel unit are of the same shape and an equal area.

To achieve the above object, the present invention provides a light-emitting device comprising the above pixel structure.

To achieve the above object, the present invention provides an array substrate comprising a substrate and the above light-emitting device formed above the substrate.

To achieve the above object, the present invention provides a display device comprising the above array substrate.

To achieve the above object, the present invention provides a manufacturing method of a pixel structure, and the method comprises:

forming a plurality of color sub-pixel units through evaporation process so as to form a plurality of pixel units which are sequentially arranged, wherein in each pixel unit, the color sub-pixel unit of a certain color to which human eyes have poor discriminating power is positioned in a central position of the pixel unit, and the color sub-pixel units of the remaining colors are positioned around the color sub-pixel unit of the certain color, and an area of the color sub-pixel unit of the certain color is larger than that of any one of the color sub-pixel units of the remaining colors.

Optionally, the plurality of color sub-pixel units comprise: red sub-pixel units, green sub-pixel units and blue sub-pixel units, the color sub-pixel units of the certain color comprise the blue sub-pixel units, the color sub-pixel units of the remaining colors comprise the red sub-pixel units and the green sub-pixel units; and forming the plurality of pixel units which are sequentially arranged through evaporation process includes steps of:
forming the red sub-pixel units through evaporation process;
forming the green sub-pixel units through evaporation process; and
forming the blue sub-pixel units through evaporation process.

Beneficial effects achieved by the present invention are as follows:

In the technical solutions of the pixel structure and the manufacturing method thereof, the light-emitting device, the array substrate and the display device provided by the present invention, each pixel unit comprises a plurality of color sub-pixel units, wherein the color sub-pixel unit of a certain color is positioned in a central position of the pixel unit, and has an area larger than an area of any one of the color sub-pixel units of the remaining colors; by optimizing the arrangement and areas of the respective color sub-pixel units, the present invention can make up for the deficiency that human eyes have relatively poor discriminating power to color sub-pixel units of the certain color, thus making the matching effect between the color sub-pixel units and the visual sense of human eyes better and improving chromaticity uniformity of display image.

DETAILED DESCRIPTION OF THE EMBODIMENTS

To enable those skilled in the art to better understand technical solutions of the present invention, a pixel structure and a manufacturing method thereof, a light-emitting device, an array substrate and a display device provided by the present invention are described in detail below in conjunction with the accompanying drawings.

Figure 1:
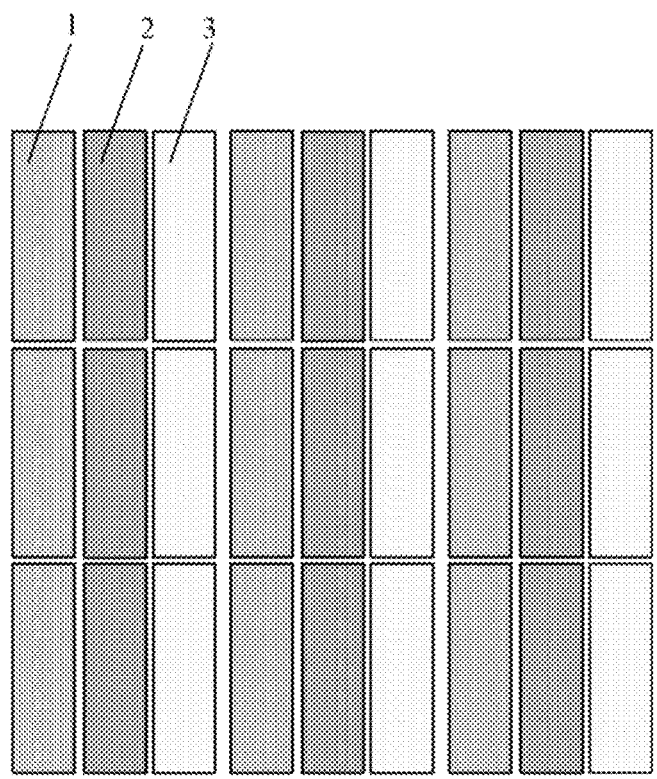
FIG. 1 is a schematic diagram of a pixel structure in the prior art.
Figure 2:
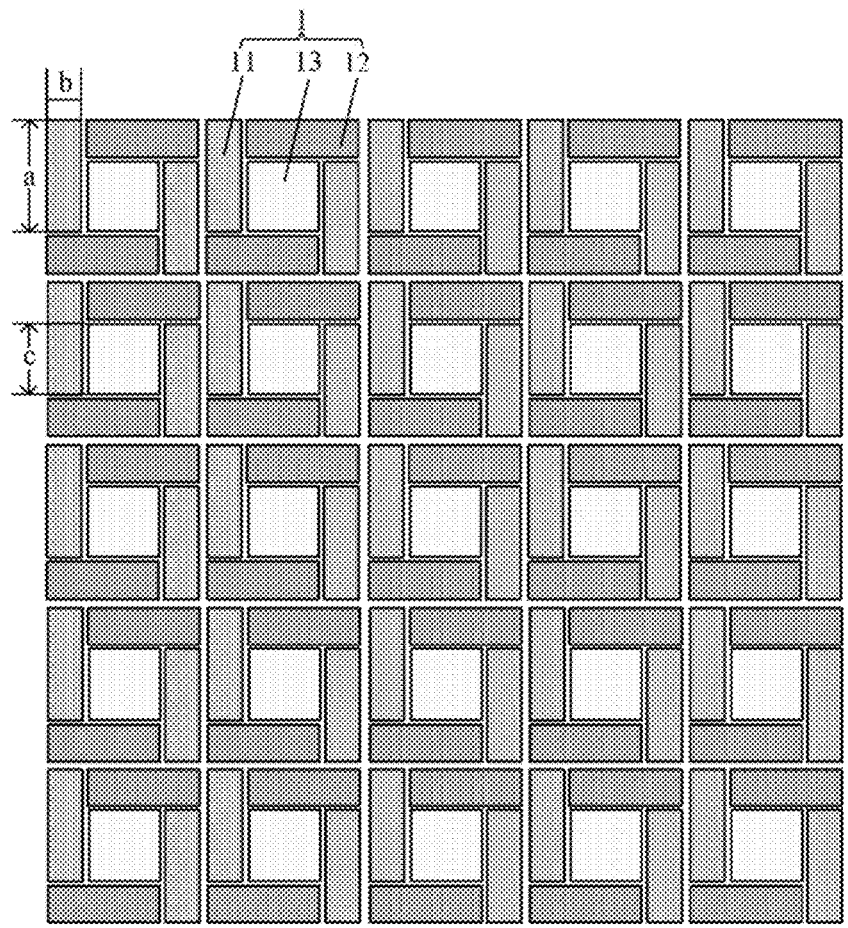
FIG. 2 is a schematic diagram of a pixel structure provided by an embodiment of the present invention.

FIG. 2 is a schematic diagram of a pixel structure provided by an embodiment of the present invention, as shown in FIG. 2, the pixel structure comprises: a plurality of pixel units 1 which are sequentially arranged, each pixel unit 1 comprises a plurality of color sub-pixel units, wherein the color sub-pixel unit of a certain color is positioned in a central position of the pixel unit, and the color sub-pixel units of the remaining colors are positioned around the color sub-pixel unit of the certain color, and an area of the color sub-pixel unit of the certain color is larger than an area of any one of the color sub-pixel units of the remaining colors.

Preferably, the plurality of pixel units 1 are sequentially arranged in an array. In practical application, the plurality of pixel units 1 may also be arranged in other manners, which are not listed one by one herein.

Among the plurality of color sub-pixel units, human eyes have relatively poor discriminating power to the color sub-pixel unit of the certain color, while have relatively strong discriminating power to the color sub-pixel units of the remaining colors. In other words, the color sub-pixel unit of the certain color may be a sub-pixel to which human eyes have poor discriminating power.

The color sub-pixel unit may comprise a red sub-pixel unit, a green sub-pixel unit or a blue sub-pixel unit. In the present embodiment, as shown in FIG. 2, the plurality of color sub-pixel units may comprise: red sub-pixel units 11, green sub-pixel units 12 and a blue sub-pixel unit 13, wherein the color sub-pixel unit of the certain color comprises the blue sub-pixel unit 13, and the color sub-pixel units of the remaining colors comprise the red sub-pixel units 11 and the green sub-pixel units 12. Specifically, the blue sub-pixel unit 13 is positioned in the central position of the pixel unit 1, and the red sub-pixel units 11 and the green sub-pixel units 12 are provided around the blue sub-pixel unit 13.

In one pixel unit 1, an amount of the blue sub-pixel unit 13 is one, an amount of the red sub-pixel units 11 is two, and an amount of the green sub-pixel units 12 is two. Preferably, the red sub-pixel units 11 and the green sub-pixel units 12 may be alternately provided around the blue sub-pixel unit 13. Further, the two red sub-pixel units 11 are provided opposite each other, and the two green sub-pixel units 12 are provided opposite each other.

Preferably, both the red sub-pixel units 11 and the green sub-pixel units 12 are of a rectangular shape, and the blue sub-pixel unit 13 is of a square shape.

Preferably, each pixel unit 1 is of a square shape. That is to say, the red sub-pixel units 11, the green sub-pixel units 12 and the blue sub-pixel unit 13 are all set to have proper sizes, so that the pixel unit 1 constituted of two red sub-pixel units 11, two green sub-pixel units 12 and one blue sub-pixel unit 13 is a rectangle.

Preferably, the red sub-pixel units 11 and the green sub-pixel units 12 are of the same shape and an equal area.

Further, a length of each of the red sub-pixel units 11 and the green sub-pixel units 12 is three times as long as a width thereof, and a side length of the blue sub-pixel unit 13 is twice the width of the red sub-pixel unit 11.

In the present embodiment, an area of the blue sub-pixel unit 13 is larger than that of the red sub-pixel unit 11, and is also larger than that of the green sub-pixel unit 12. As shown in FIG. 2, the lengths of the red sub-pixel unit 11 and the green sub-pixel unit 12 are both a, the widths of the red sub-pixel unit 11 and the green sub-pixel unit 12 are both b, the side length of the blue sub-pixel unit 13 is c, and a=3b, c=2b=a-b. Accordingly, the area of the red sub-pixel unit 11 is $S1=a*b=3b^2$, the area of the green sub-pixel unit 12 is $S2=a*b=3b^2$, the area of the blue sub-pixel unit 13 is $S3=c^2=4b^2$, it can thus be seen from the above formulae that S3 is larger than both S1 and S2, that is, the area of the blue sub-pixel unit 13 is larger than that of the red sub-pixel unit 11, and is also larger than that of the green sub-pixel unit 12

Figure 3:
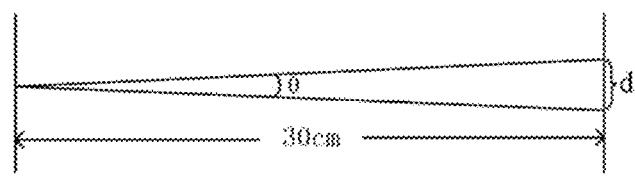
FIG. 3 is a schematic diagram illustrating human eye's discriminating power to an image.

Human eyes have different sensing capabilities to three primary colors of red (R), green (G) and blue (B). R corresponds to red-sensing cone cells, G corresponds to green-sensing cone cells and B corresponds to blue-sensing cone cells. In human eyes, an amount of the green-sensing cone cells is the most, an amount of the red-sensing cone cells is slightly smaller than that of the green-sensing cone cells and an amount of the blue-sensing cone cells is the least. Human eyes have luminance channels and chrominance channels, discriminating power of the luminance channel is several times as strong as that of the chrominance channel, and in the luminance channel, blue-sensing cone cells contribute little to the luminance channel. The chrominance channels of human eyes are generally classified into a red and green chrominance channel and a yellow and blue chrominance channel, which have different discriminating powers to a color. FIG. 3 is a schematic diagram illustrating human eyes' discriminating power to an image, as shown in FIG. 3, when a distance from a human eye to a display image is about 30 cm, discriminating power 0 of the human eye to a red or green image is 0.12°, while discriminating power 0 to a blue image is 0.25°. Here, discriminating power 0 of the human eye to a red or green image being 0.12° means that a width d of a display image that can be seen is 1.27 mm when the distance from the human eye to the display image is about 30 cm, and discriminating power 0 of the human eye to a blue image being 0.25° means that a width d of a display image that can be seen is 0.625 mm when the distance from the human eye to the display image is about 30 cm. Therefore, the discriminating power of human eyes to a red or green image is stronger than that to a blue image.

In the present embodiment, in each pixel unit, the blue sub-pixel unit is positioned in a central position of the pixel unit and is set to have an area larger than those of both the red sub-pixel units and the green sub-pixel units, by setting the sub-pixel unit to which human eyes have relatively poor discriminating power to have a larger area and be positioned in the center of the pixel unit, the arrangement and areas of the sub-pixel units are optimized, and the deficiency that human eyes have relatively poor discriminating power to blue sub-pixel units is remedied, thus optimizing the matching effect between the color sub-pixel units and the visual sense of human eyes and improving chromaticity uniformity of display image.

Further, an embodiment of the present invention provides a light-emitting device, which may comprise a pixel structure, and the pixel structure may adopt the pixel structure described in the above embodiment, and is not repeated herein.

Further, the light-emitting device may further comprise: a first electrode provided below the pixel structure and a second electrode provided above the pixel structure. For example, the first electrode is cathode, and the second electrode is anode; alternatively, the first electrode is anode, and the second electrode is cathode.

In the light-emitting device provided by the present embodiment, each pixel unit comprises a plurality of color sub-pixel units, wherein, the color sub-pixel unit of a certain color is positioned in a central position of the pixel unit, and has an area larger than an area of any one of the color sub-pixel units of the remaining colors. By optimizing the arrangement and areas of the color sub-pixel units, the present embodiment can make up for the deficiency that human eyes have relatively poor discriminating power to color sub-pixel units of the certain color, thus making the matching effect between the color sub-pixel units and the visual sense of human eyes better and improving chromaticity uniformity of display image.

Figure 4:
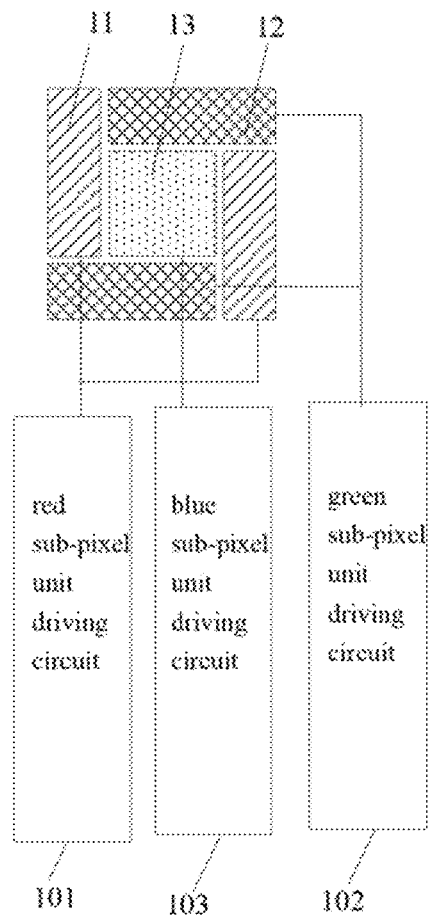
FIG. 4 is a schematic diagram of an equivalent circuit of a pixel unit driving circuit provided by an embodiment of the present invention.

Further, an embodiment of the present invention provides an array substrate, which comprises a substrate and a light-emitting device formed above the substrate, the light-emitting device may adopt the light-emitting device described in the above embodiment and is not repeated herein. FIG. 4 is a schematic diagram of an equivalent circuit of a pixel unit driving circuit in the present embodiment, as shown in FIG. 4, the array substrate further comprises a pixel unit driving circuit. Preferably, in each pixel unit, the pixel unit driving circuit may comprise: a red sub-pixel unit driving circuit 101, a green sub-pixel unit driving circuit 102 and a blue sub-pixel unit driving circuit 103. The red sub-pixel unit driving circuit 101 is used for driving the red sub-pixel units 11 (in the present embodiment, the red sub-pixel unit driving circuit 101 is used for driving two red sub-pixel units 11 simultaneously), the green sub-pixel unit driving circuit 102 is used for driving the green sub-pixel units 12 (in the present embodiment, the green sub-pixel unit driving circuit 102 is used for driving two green sub-pixel units 12 simultaneously), and the blue sub-pixel unit driving circuit 103 is used for driving the blue sub-pixel unit 13.

In the present embodiment, the red sub-pixel unit driving circuit 101, the blue sub-pixel unit driving circuit 102 and the blue sub-pixel unit driving unit 103 may all be thin film transistors (TFTs). Preferably, each TFT may be formed on the substrate and below the light-emitting device.

In the array substrate provided by the present embodiment, each pixel unit comprises a plurality of color sub-pixel units, wherein, the color sub-pixel unit of a certain color is positioned in a central position of the pixel unit, and has an area larger than an area of any one of the color sub-pixel units of the remaining colors. By optimizing the arrangement and areas of the color sub-pixel units, the present embodiment can make up for the deficiency that human eyes have relatively poor discriminating power to color sub-pixel units of the certain color, thus making the matching effect between the color sub-pixel units and the visual sense of human eyes better and improving chromaticity uniformity of display image.

Further, an embodiment of the present invention provides a display device, which comprises an array substrate, wherein the array substrate may adopt the array substrate described in the above embodiment and is not repeated herein.

The above display device may be an organic light-emitting device (OLED).

Further, an embodiment of the present invention provides a manufacturing method of a pixel structure, and the method comprises: forming a plurality of pixel units which are sequentially arranged through evaporation process, each pixel unit comprising a plurality of color sub-pixel units, wherein in each pixel unit, the color sub-pixel unit of a certain color is positioned in a central position of the pixel unit, and the color sub-pixel units of the remaining colors are positioned around the color sub-pixel unit of the certain color, and an area of the color sub-pixel unit of the certain color is larger than that of any one of the color sub-pixel units of the remaining colors.

Figure 5:
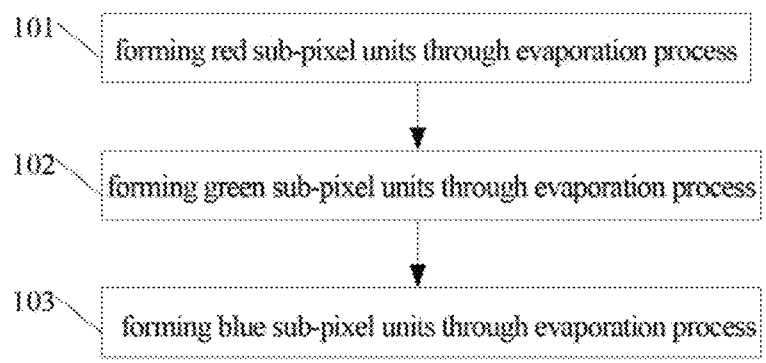
FIG. 5 is a flowchart of a manufacturing method of a pixel structure provided by an embodiment of the present invention.

The manufacturing method of a pixel structure is described in detail below by taking a specific embodiment as an example. In the present embodiment, the plurality of color sub-pixel units comprise: red sub-pixel units, green sub-pixel units and blue sub-pixel units, the color sub-pixel units of the certain color comprise the blue sub-pixel units, and the color sub-pixel units of the remaining colors comprise the red sub-pixel units and the green sub-pixel units. FIG. 5 is a flowchart of a manufacturing method of a pixel structure provided by an embodiment of the present invention, and as shown in FIG. 5, the method comprises steps 101 to 103.

At step 101, the red sub-pixel units are formed through evaporation process.

Figure 6A:
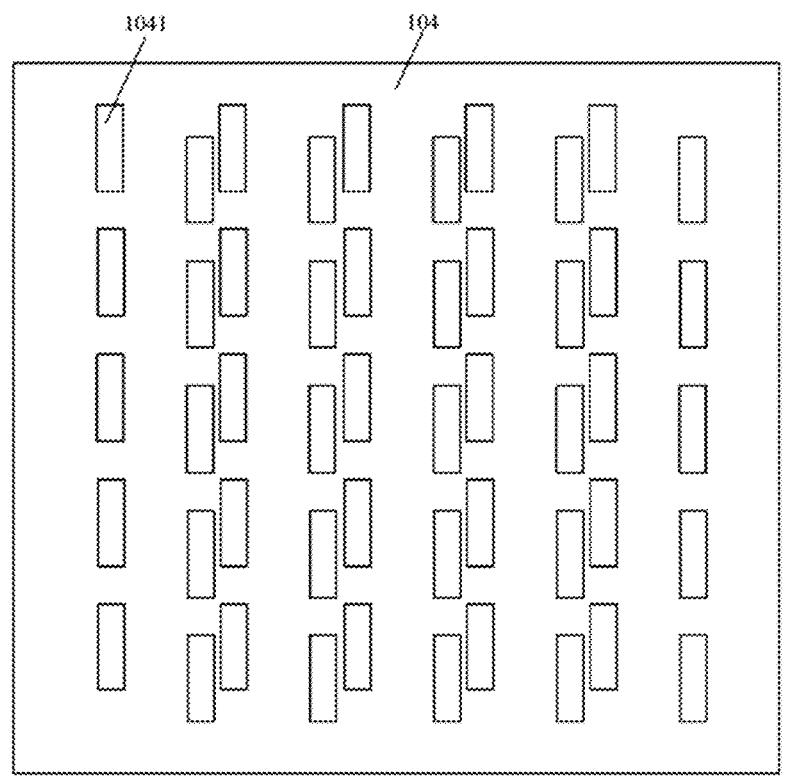
FIG. 6a is a schematic diagram of a structure of a mask for red sub-pixel units used in the method shown in FIG. 5.
Figure 6B:
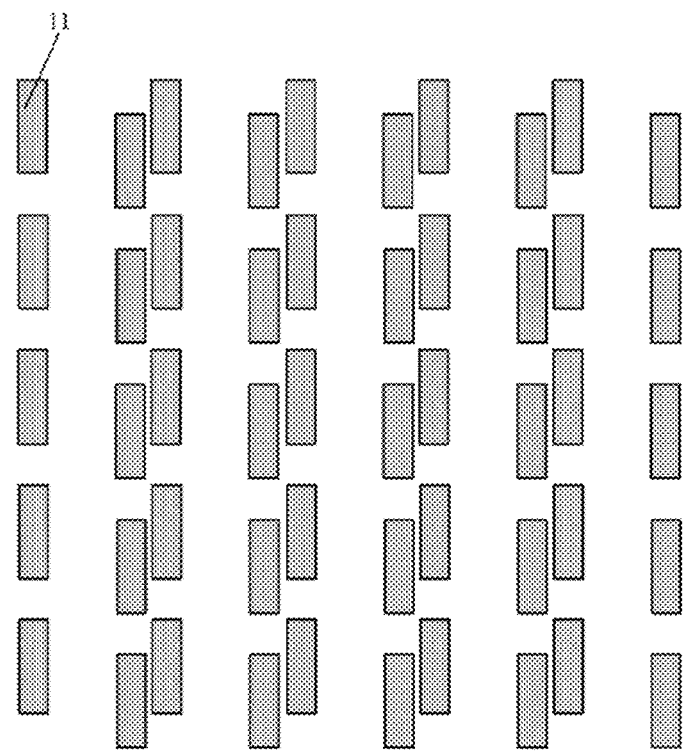
FIG. 6b is a schematic diagram of red sub-pixel units formed in the method shown in FIG. 5.

FIG. 6a is a schematic diagram of a structure of a mask for red sub-pixel units in the present embodiment, and FIG. 6b is a schematic diagram of red sub-pixel units formed in the present embodiment. As shown in FIGS. 6a and 6b, red opening regions 1041, which are arranged correspondingly to the red sub-pixel units 11 and used for forming the red sub-pixel units 11, are provided in the mask for red sub-pixel units 104. Accordingly, the step 101 specifically includes: forming the red sub-pixel units 11 through evaporation process by using the mask for red sub-pixel units 104.

At step 102, the green sub-pixel units are formed through evaporation process.

Figure 6C:
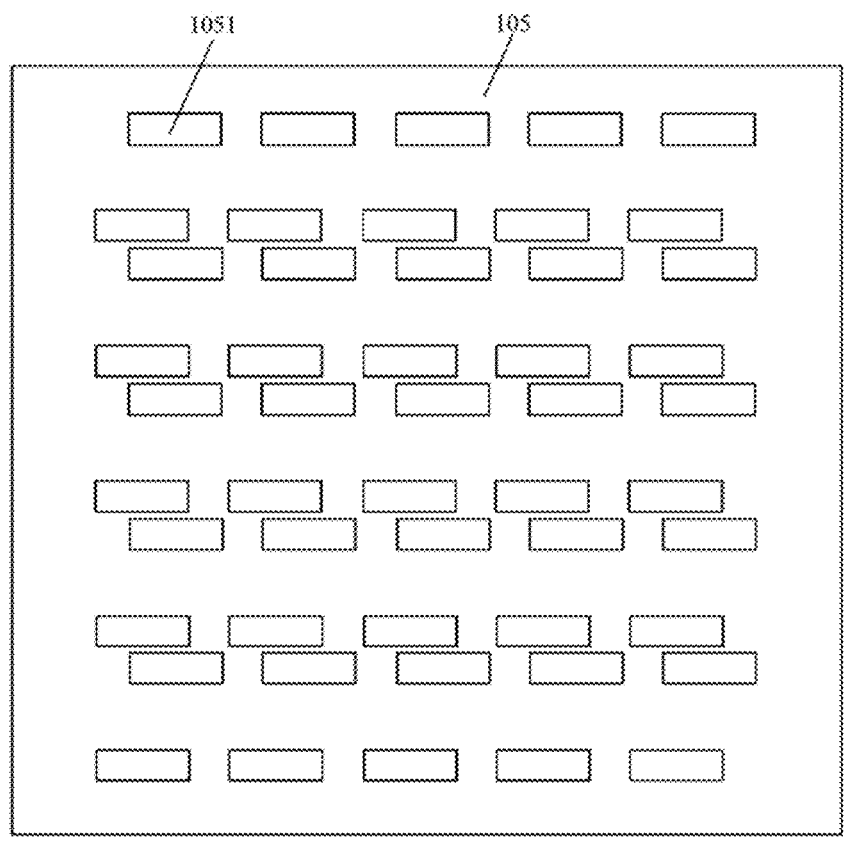
FIG. 6c is a schematic diagram of a structure of a mask for green sub-pixel units used in the method shown in FIG. 5.
Figure 6D:
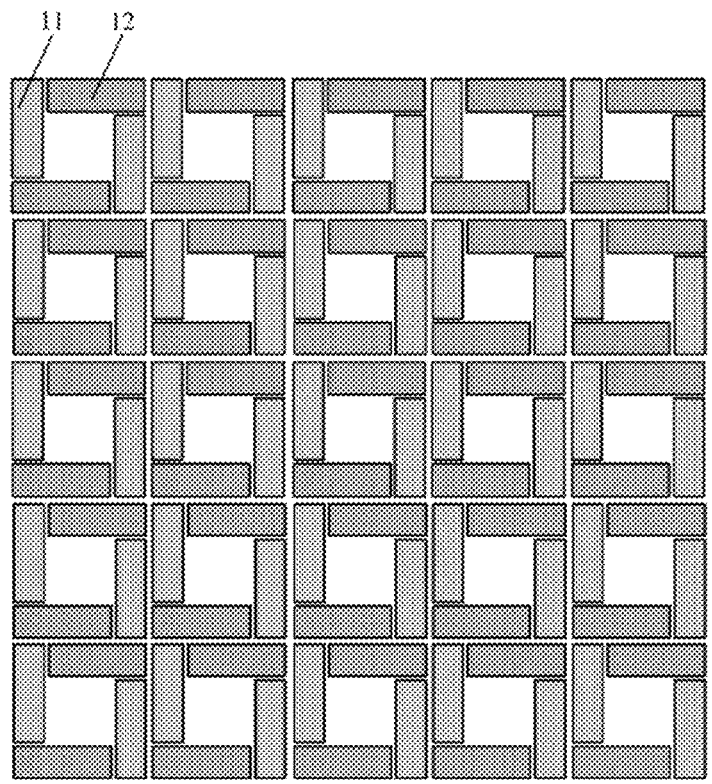
FIG. 6d is a schematic diagram of green sub-pixel units formed in the method shown in FIG. 5.

FIG. 6c is a schematic diagram of a structure of a mask for green sub-pixel units in the present embodiment, and FIG. 6d is a schematic diagram of green sub-pixel units formed in the present embodiment. As shown in FIGS. 6c and 6d, green opening regions 1051, which are arranged correspondingly to the green sub-pixel units 12 and used for forming the green sub-pixel units 12, are provided in the mask for green sub-pixel units 105. Accordingly, the step 102 specifically includes: forming the green sub-pixel units 12 through evaporation process by using the mask for green sub-pixel units 105.

At step 103, the blue sub-pixel units are formed through evaporation process, each of the blue sub-pixel units is positioned in the central position of the pixel unit, and the red sub-pixel units and the green sub-pixel units are provided around the blue sub-pixel units.

Figure 6E:
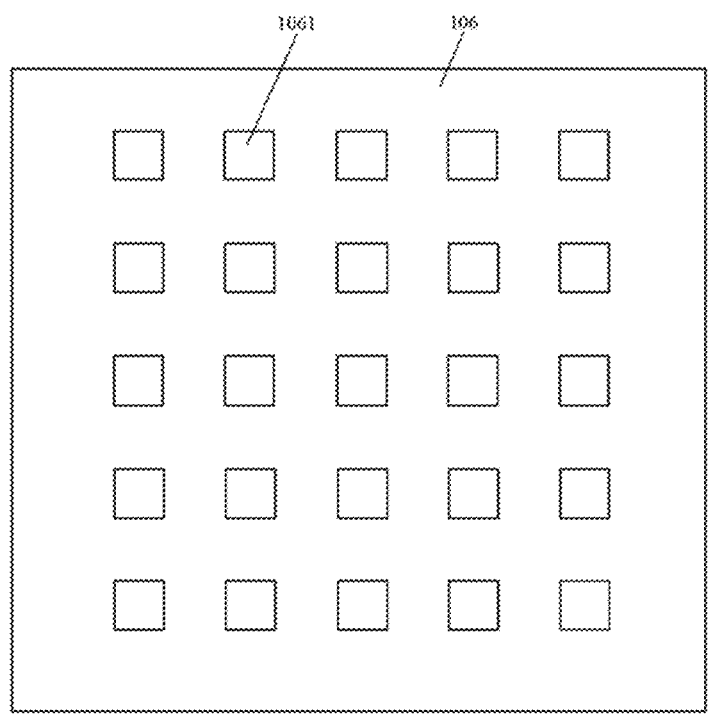
FIG. 6e is a schematic diagram of a structure of a mask for blue sub-pixel units used in the method shown in FIG. 5.

FIG. 6e is a schematic diagram of a structure of a mask for blue sub-pixel units in the present embodiment, and as shown in FIGS. 6e and 3, blue opening regions 1061, which are arranged correspondingly to the blue sub-pixel units 13 and used for forming the blue sub-pixel units 13, are provided in the mask for blue sub-pixel units 106. Accordingly, the step 103 specifically includes: forming the blue sub-pixel units 13 through evaporation process by using the mask for blue sub-pixel units 106.

The sequence in which the above steps are performed in the present embodiment is merely an example, and may be adjusted as required in practical application.

The manufacturing method of a pixel structure provided by the present embodiment can be used for manufacturing the pixel structure provided by the above embodiment of the present invention, description of the pixel structure may refer to the above embodiment, and is not repeated herein.

In the pixel structure manufactured by using the manufacturing method of a pixel structure provided by the present embodiment, each pixel unit comprises a plurality of color sub-pixel units, wherein, the color sub-pixel unit of a certain color is positioned in a central position of the pixel unit, and has an area larger than an area of any one of the color sub-pixel units of the remaining colors. By optimizing the arrangement and areas of the color sub-pixel units, the present embodiment can make up for the deficiency that human eyes have relatively poor discriminating power to color sub-pixel units of the certain color, thus making the matching effect between the color sub-pixel units and the visual sense of human eyes better and improving chromaticity uniformity of display image. Compared to the prior art, the manufacturing method of a pixel structure provided by the present embodiment only needs to change the patterns of opening regions in the mask, and does not need to change the manufacturing process, thus making the manufacturing process simply and easy to implement.

It can be understood that the above implementations are merely exemplary implementations used for explaining the principle of the present invention, but the present invention is not limited thereto. For those skilled in the art, various modifications and improvements may be made without departing from the spirit and essence of the present invention, and these modifications and improvements may also be considered to be within the protection scope of the present invention.

The invention claimed is:

1. A pixel structure, comprising: a plurality of pixel units which are sequentially arranged, each pixel unit comprising a plurality of color sub-pixel units, wherein a color sub-pixel unit of a certain color to which human eyes have the poorest discriminating power among the plurality of color sub-pixel units is positioned in a central position of the pixel unit, and color sub-pixel units of the remaining colors are positioned around the color sub-pixel unit of the certain color, and an area of the color sub-pixel unit of the certain color is larger than that of any one of the color sub-pixel units of the remaining colors, wherein the color sub-pixel units of the remaining colors are of a rectangular shape, the color sub-pixel unit of the certain color is of a square shape, and a length of each of the color sub-pixel units of the remaining colors is three times as long as a width thereof, and a side length of the color sub-pixel unit of the certain color is twice the width of each of the color sub-pixel units of the remaining colors.

2. The pixel structure according to claim 1, wherein the plurality of color sub-pixel units comprise: at least one red sub-pixel unit, at least one green sub-pixel unit and at least one blue sub-pixel unit, the color sub-pixel unit of the certain color comprises the at least one blue sub-pixel unit, the color sub-pixel units of the remaining colors comprise the at least one red sub-pixel unit and the at least one green sub-pixel unit.

3. The pixel structure according to claim 1, wherein, in each pixel unit, an amount of the at least one blue sub-pixel unit is one, an amount of the at least one red sub-pixel unit is two, and an amount of the at least one green sub-pixel unit is two.

4. The pixel structure according to claim 3, wherein the red sub-pixel units and the green sub-pixel units are alternately provided around the blue sub-pixel unit.

5. The pixel structure according to claim 3, wherein the two red sub-pixel units are provided opposite each other, and the two green sub-pixel units are provided opposite each other.

6. The pixel structure according to claim 1, wherein each pixel unit is of a square shape.

7. The pixel structure according to claim 2, wherein each pixel unit is of a square shape.

8. The pixel structure according to claim 3, wherein each pixel unit is of a square shape.

9. The pixel structure according to claim 2, wherein the red sub-pixel unit and the green sub-pixel unit are of the same shape and an equal area.

10. The pixel structure according to claim 6, wherein the red sub-pixel unit and the green sub-pixel unit are of the same shape and an equal area.

11. The pixel structure according to claim 7, wherein the red sub-pixel unit and the green sub-pixel unit are of the same shape and an equal area.

12. The pixel structure according to claim 8, wherein the red sub-pixel unit and the green sub-pixel unit are of the same shape and an equal area.

13. An array substrate, comprising a substrate and a light-emitting device formed above the substrate, wherein the light-emitting device comprises the pixel structure according to claim 1.

14. A display device, comprising the array substrate according to claim 13.

15. A manufacturing method of a pixel structure, comprising:
   forming a plurality of color sub-pixel units through evaporation process so as to form a plurality of pixel units which are sequentially arranged, wherein, in each pixel unit, a color sub-pixel unit of a certain color to which human eyes have the poorest discriminating power among the plurality of color sub-pixel units is positioned in a central position of the pixel unit, and color sub-pixel units of the remaining colors are positioned around the color sub-pixel unit of the certain color, and an area of the color sub-pixel unit of the certain color is larger than that of any one of the color sub-pixel units of the remaining colors; and the color sub-pixel units of the remaining colors are of a rectangular shape, the color sub-pixel unit of the certain color is of a square shape, and a length of each of the color sub-pixel units of the remaining colors is three times as long as a width thereof, and a side length of the color sub-pixel unit of the certain color is twice the width of each of the color sub-pixel units of the remaining colors.

16. The manufacturing method of a pixel structure according to claim 15, wherein the plurality of color sub-pixel units comprise: red sub-pixel units, green sub-pixel units and blue sub-pixel units, the color sub-pixel units of the certain color comprise the blue sub-pixel units, the color sub-pixel units of the remaining colors comprise the red sub-pixel units and the green sub-pixel units; and forming the plurality of pixel units which are sequentially arranged through evaporation process includes steps of:

forming the red sub-pixel units through evaporation process;

forming the green sub-pixel units through evaporation process; and forming the blue sub-pixel units through evaporation process.

* * * * *